(12) United States Patent
Xu et al.

(10) Patent No.: US 7,991,302 B2
(45) Date of Patent: Aug. 2, 2011

(54) METHOD AND APPARATUS FOR OPTICAL SIGNALING

(75) Inventors: Jianping Xu, Portland, OR (US);
Fabrice Paillet, Hillsboro, OR (US);
Tanay Karnik, Portland, OR (US);
Donald S. Gardner, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 1299 days.

(21) Appl. No.: 10/816,026

(22) Filed: Mar. 31, 2004

(65) Prior Publication Data

US 2004/0258419 A1 Dec. 23, 2004

Related U.S. Application Data

(63) Continuation-in-part of application No. 10/317,709, filed on Dec. 11, 2002, now Pat. No. 6,737,924.

(51) Int. Cl.
*H04B 10/06* (2006.01)
*H01S 3/00* (2006.01)

(52) U.S. Cl. ..................... 398/209; 372/38.02

(58) Field of Classification Search .................. None
See application file for complete search history.

(56) References Cited

U.S. PATENT DOCUMENTS

| 4,592,057 A * | 5/1986 | Comerford | 372/38.02 |
| 6,130,562 A * | 10/2000 | Bosch et al. | 372/38.02 |
| 6,294,933 B1 * | 9/2001 | Chun et al. | 326/86 |
| 6,735,228 B2 * | 5/2004 | Tsai | 372/38.02 |
| 2001/0021051 A1 * | 9/2001 | Kim | 359/161 |
| 2002/0027689 A1 * | 3/2002 | Bartur et al. | 359/152 |

* cited by examiner

*Primary Examiner* — Minsun Harvey
*Assistant Examiner* — Sean Hagan
(74) *Attorney, Agent, or Firm* — Garrett IP, LLC

(57) ABSTRACT

A method and apparatus for optical signaling. In one embodiment, a laser driver converts a digital voltage sequence to a current signal having a bias mode adjustable by a bias control and a modulation mode adjustable by a modulation control. A laser generates an optical signal responsive to the current signal of the laser driver. In one embodiment, a photo-detector receives an optical signal and generates a single ended current signal. A transimpedance amplifier circuit converts the single ended current signal to a differential voltage signal. A clock recovery circuit generates an aligned clock signal and a sampler circuit uses the aligned clock signal to retrieve a digital voltage sequence.

3 Claims, 11 Drawing Sheets

METHOD AND APPARATUS FOR OPTICAL SIGNALING

RELATED APPLICATIONS

This is a continuation-in-part application claiming, under 35 U.S.C. §120, the benefit of the filing date of U.S. application Ser. No. 10/317,709, filed Dec. 11, 2002 now U.S. Pat. No. 6,737,924, currently pending.

FIELD OF THE DISCLOSURE

This disclosure relates generally to the field of optical communications. In particular, the disclosure relates to a method using integrated high speed optical I/O circuitry for digital interconnects.

BACKGROUND OF THE DISCLOSURE

In the past decade optical communications has become an integral technology component for information systems. As semiconductor technology and advanced computing architectures have resulted in processors that operate at frequencies in multiples of GHz, electrical interconnects have become performance bottlenecks.

In 1998, researchers at Bell Labs transmitted 100 simultaneous optical signals using dense wave-division multiplexing over a distance of 400 km, each signal transmitted at a rate of 10 Gbps (gigabits per second). Therefore, optical interconnects show great promise in meeting the ever increasing demand for high speed communications.

The physical layer of an optical communication system may include a transmitter and a receiver, which communicate through an optical pipe such as an optical fiber or a wave guide. The optical transmitter may typically include a light emitter, circuitry to drive or modulate optical signals through the light emitter in response to electronic signals, a clock, and circuitry to convert and/or to encode data into a sequence of electronic signals. The optical receiver may typically include a light detector, circuitry to amplify the output of the light detector, clock recovery circuitry, and circuitry to sample and/or decode the data from the received signals.

Several characteristics of optical communication systems are critical to design choices. Speed is one of the most important characteristics. The rate at which an optical signal can be modulated and the transmitted data can be recovered, may determine, for example, the type of light emitter used, the design of the circuitry to drive or modulate the optical signals through the light emitter and/or the circuitry to amplify the output of the light detector and sample received signals. If an optical communication system is to be suitable to present and future processors operating at frequencies in multiples of GHz, it must be scalable at least to data rates of multiple Gbps.

Cost is another important characteristic of an optical communication system to be used as a component in information systems. If the optical components are not available in cost competitive technologies that are compatible with other components of the information system, they provide little advantage over duplication of existing electrical interconnects.

Reliability of the optical communication system in a variety of operating conditions and accounting for various manufacturing process variations is yet another important characteristic. The optical communication system must be reliable even if components of one manufacturing process are connected to components of another manufacturing process and these components must continue to be reliable, for example, in conditions of great heat or cold.

Such considerations have not been sufficiently addressed in prior art optical communication systems.

BRIEF DESCRIPTION OF THE DRAWINGS

The present invention is illustrated by way of example and not limitation in the figures of the accompanying drawings.

DETAILED DESCRIPTION

Methods and apparatus for optical signaling are disclosed herein. In one embodiment comprising a transmitter, a laser driver converts a digital voltage sequence to a current signal having a bias mode adjustable by a bias control and a modulation mode adjustable by a modulation control. A laser generates an optical signal responsive to the current signal of the laser driver. One embodiment of a laser driver for high speed optical interconnections includes a buffered level shifter (BLS) to shift the input voltage level to an appropriate level. In some embodiments the BLS may be tuned to provide a desired level shift with an impedance matched to the driving load. In some embodiments circuitry may also be provided to reduce any overshoot of the output signal and/or to reduce a series resistance.

In one alternative embodiment comprising a receiver, a photo-detector receives an optical signal and generates a single ended current signal. A transimpedance amplifier circuit converts the single ended current signal to a differential voltage signal. Some embodiments of the transimpedance amplifier circuit include an impedance matching capacitance for differential impedance matching. A clock recovery circuit generates an aligned clock signal and a sampler circuit retrieves a digital voltage sequence from the aligned clock signal and the differential voltage signal.

These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention measured only in terms of the claims and their equivalents.

Figure 1A:
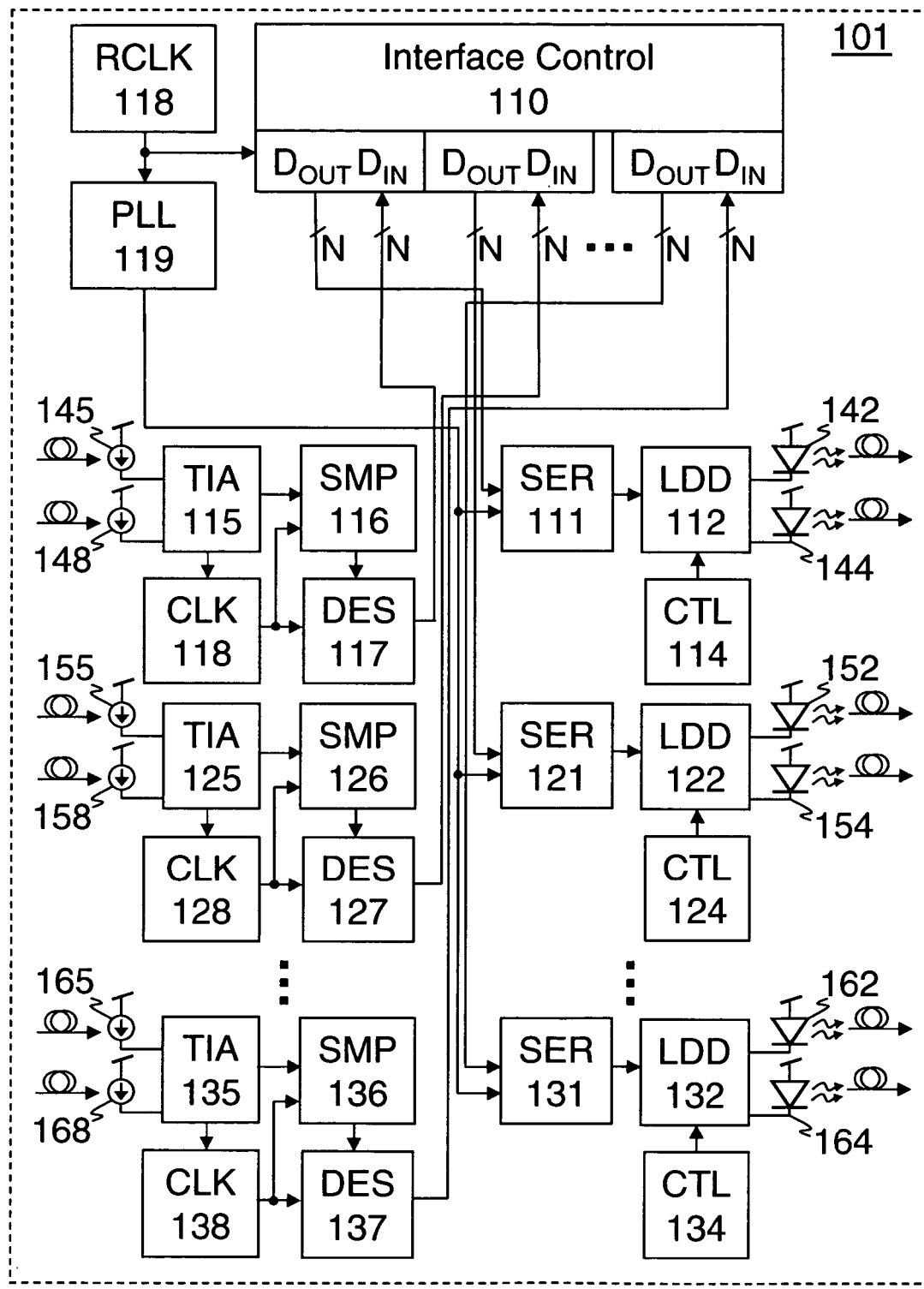
FIG. 1a illustrates an embodiment of an optical signaling system.

FIG. 1a illustrates an embodiment of an exemplary optical signaling system 101. One such embodiment of optical signaling system 101 comprises an interface control 110 to interface with devices (not shown) for transmission and reception of data via optical signaling system 101, and a phase locked loop (PLL) circuit 119 to generate a clock signal from reference clock 118. Optical signaling system 101 also comprises serializer circuits 111, 121, . . . 131, each to receive the clock signal from PLL circuit 119 and to convert N-bit data from interface control 110 to a digital voltage input sequence for laser diode drivers 112, 122, . . . 132 respectively. Laser diode driver circuits 112, 122, . . . 132 are respectively coupled with control circuitry 114, 124, . . . 134, each comprising a bias control circuit and/or a modulation control circuit. Each of the laser diode driver circuits 112, 122, . . . 132 may receive a digital voltage input sequence and generate a corresponding current signal having a bias mode adjustable by their respective bias control circuit and a modulation mode adjustable by their respective modulation control circuit. Details of the bias control and modulation control are discussed further below, especially with respect to FIGS. 6a and 6b.

Laser diodes 142, 152, . . . 162 respectively generate optical signals responsive to the current signals of the laser diode drivers 112, 122, . . . 132. For some embodiments of optical signaling system 101, each of the laser diode driver circuits 112, 122, . . . 132 may also generate a corresponding current signal for the clock signal from PLL circuit 119. In such embodiment, laser diodes 144, 154, . . . 164 respectively generate optical clock signals responsive to the laser diode drivers 112, 122, . . . 132. The optical signals from laser diodes 142, 152, . . . 162 and optionally from laser diodes 144, 154, . . . 164 are transmitted, for example, through optical fibers or wave guides to optical receiving devices.

Photo-detectors 145, 155, . . . 165 are optically coupled to means for receiving optical data signals, for example, optical fibers or wave guides, and generate single-ended data signals in transimpedance amplifier circuits 115, 125, . . . 135 respectively. For some embodiments of optical signaling system 101, the photo-detectors 148, 158, . . . 168 receive optical clock signals and also generate single-ended clock signals in transimpedance amplifier circuits 115, 125, . . . 135 respectively. For some embodiments of optical signaling system 101, each of the transimpedance amplifier circuits 115, 125, . . . 135 may convert these single ended current signals to differential voltage signals by complimentary coupling a first single-ended voltage signal to a second single-ended voltage signal and attenuate common signal noise by resistively coupling of the single-ended voltage signals. Details of the transimpedance amplifier circuits 115, 125, . . . 135 are discussed further below, especially with respect to FIG. 7 and also in a related pending U.S. patent application titled, "Differential, Double Feedback CMOS Transimpedance Amplifier with Noise Tolerance," Ser. No. 10/317,709, filed on Dec. 11, 2002.

Clock recovery circuits 118, 128, . . . 138 may receive differential clock signals from the transimpedance amplifier circuits 115, 125, . . . 135, recover and provide clock signals to the sampler circuits 116, 126, . . . 136, and the deserializer circuits 117, 127, . . . 137, respectively. For some embodiments of optical signaling system 101, the clock recovery circuits 118, 128, . . . 138 may have a phase interpolator to generate an aligned clock signal for their corresponding differential data signals. Details of the clock recovery circuits 118, 128, . . . 138 are discussed further below, especially with respect to FIG. 9.

Sampler circuits 116, 126, . . . 136 generate digital voltage sequences responsive at least in part to the aligned clock signals of clock recovery circuits 118, 128, . . . 138 and their corresponding differential data signals. Deserializer circuits 117, 127, . . . 137 receive these digital voltage sequences from the sampler circuits 116, 126, . . . 136, and respectively convert them into N-bit data to be provided to interface control 110.

It will be appreciated that laser diodes 142, 152, . . . 162 and photo-detectors 145, 155, . . . 165 (and optionally laser diodes 144, 154, . . . 164 and photo-detectors 148, 158, . . . 168) may be directionally coupled to means for respectively transmitting and receiving optical data signals, for example, on a duplex bus in an optical tee network.

Figure 1B:
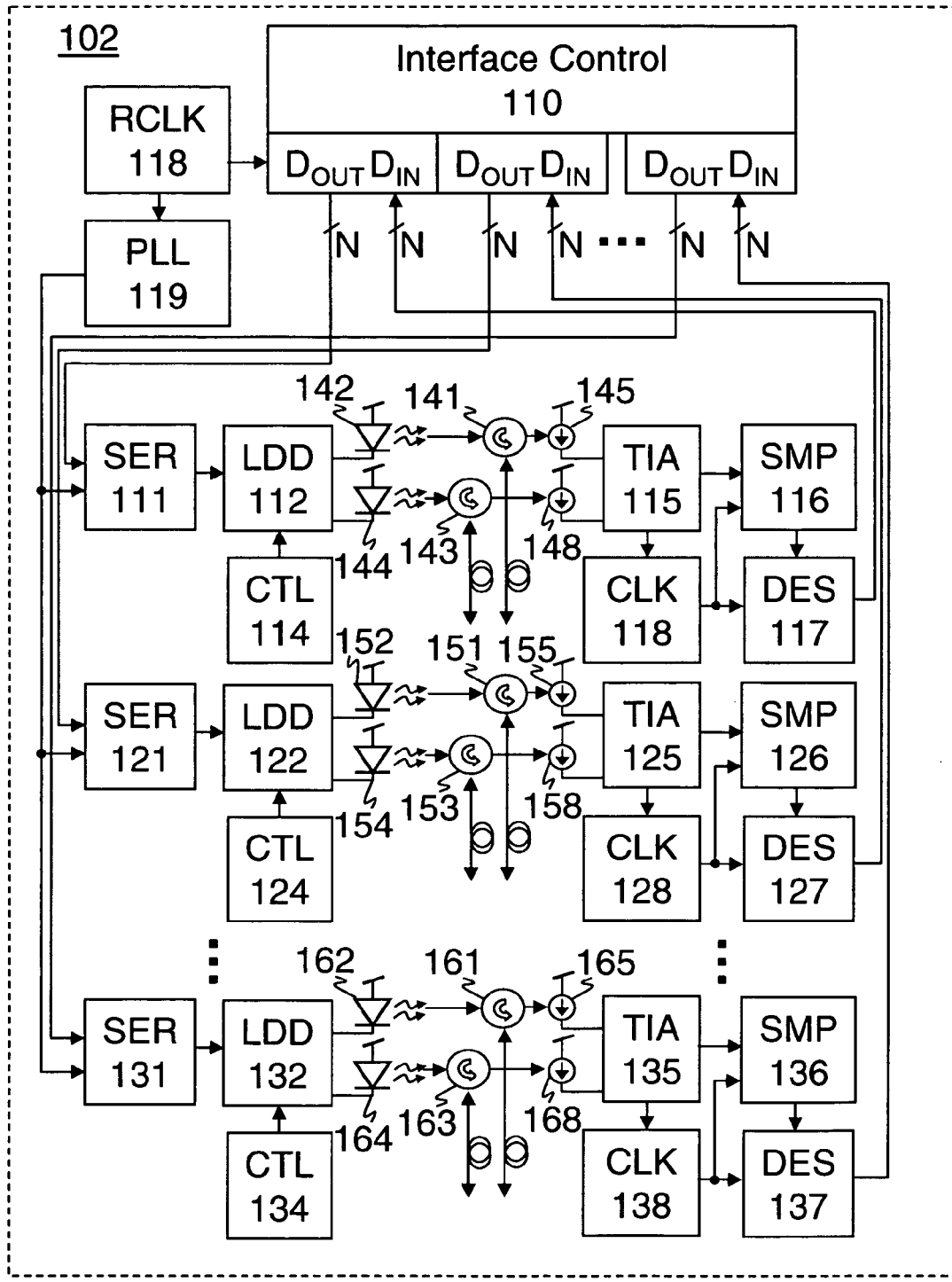
FIG. 1b illustrates an alternative embodiment of an optical signaling system.

FIG. 1b illustrates an alternative embodiment of an optical signaling system 102. Optical signaling system 102 comprises interface control 110; PLL circuit 119 to generate a clock signal from reference clock 118; serializer circuits 111, 121, . . . 131, to receive the clock signal from PLL circuit 119 and convert N-bit data from interface control 110 to a digital voltage input sequences for laser diode drivers 112, 122, . . . 132 respectively. Laser diode driver circuits 112, 122, . . . 132 are coupled with control circuitry 114, 124, . . . 134, comprising bias control circuits and/or a modulation control circuits. Laser diode driver circuits 112, 122, . . . 132 may receive digital voltage input sequences and generate corresponding current signals adjustable by control circuitry 114, 124, . . . 134.

Laser diodes 142, 152, . . . 162 generate optical signals responsive to the current signals of the laser diode drivers 112, 122, . . . 132, which also may optionally generate corresponding current signals from the clock signal for laser diodes 144, 154, . . . 164. The optical signals from laser diodes 142, 152, . . . 162 and optionally from laser diodes 144, 154, . . . 164 are provided to optical circulators 141, 151, . . . 161 and optionally to optical circulators 143, 153, . . . 163. The optical circulators are optically coupled with means for transmitting and receiving light, for example, optical fibers or wave guides, and are also optically coupled with photo-detectors 145, 155, . . . 165 and optionally with photo-detectors 148, 158, . . . 168.

Figure 7:
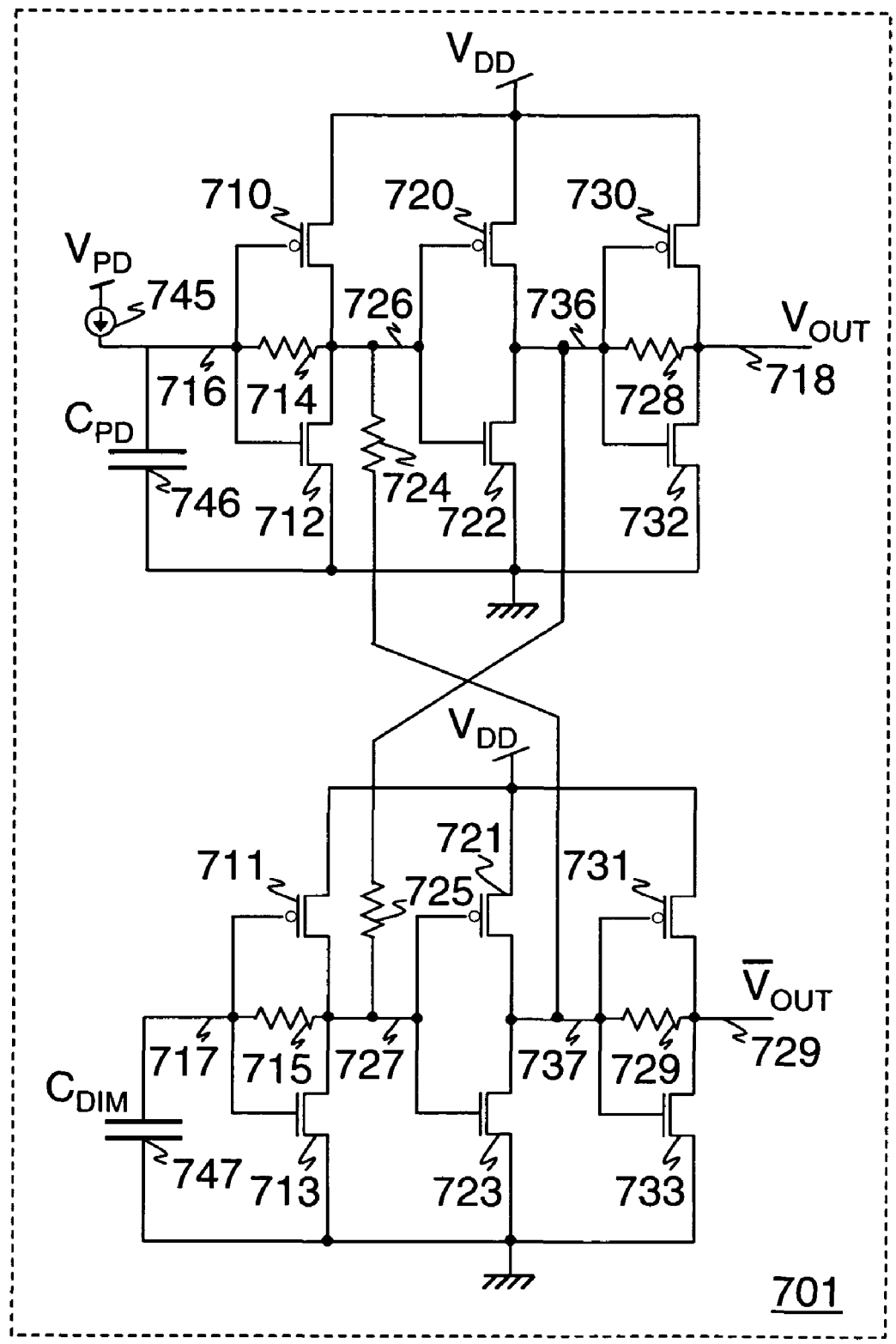
FIG. 7 illustrates an embodiment of a differential transimpedance amplifier.

Photo-detectors 145, 155, . . . 165 receive optical data signals and photo-detectors 148, 158, . . . 168 optionally receive optical clock signals and proceed to generate current signals for transimpedance amplifier circuits 115, 125, . . . 135. Transimpedance amplifier circuits 115, 125, . . . 135 convert single ended signals to differential voltage signals by pairwise coupling single ended voltage signals generated from the current from photo-detectors 145, 155, . . . 165 and optionally from photo-detectors 148, 158, . . . 168 with other single-ended voltage signals as shown in FIG. 7.

Optionally, clock recovery circuits 118, 128, . . . 138 each receive differential clock signals from transimpedance amplifier circuits 115, 125, . . . 135 and provide individual clock signals to sampler circuits 116, 126, . . . 136, and deserializer circuits 117, 127, . . . 137. Clock recovery circuits 118, 128, . . . 138 may also have a phase interpolator to generate an aligned clock signal for their corresponding differential data signals.

Sampler circuits 116, 126, . . . 136 generate digital voltage sequences responsive to the clock signals and their corresponding differential data signals from transimpedance amplifier circuits 115, 125, . . . 135. Deserializer circuits 117,

127, ... 137 convert the digital voltage sequences from the sampler circuits 116, 126, ... 136 into N-bit data to be provided to interface control 110.

It will be appreciated that alternative embodiment of an optical signaling system may comprise only the circuitry for transmitting optical signals or alternatively only the circuitry for receiving optical signals in accordance with optical signaling system 101 or 102 without departing from the principles of the present invention. It will also be appreciated that the techniques of optical signaling systems 101 or 102 may be useful with a variety of technologies, for example: in semiconductor devices with wave guides, or between devices with optical fiber, or with Fabry-Perot (FP) lasers, or with distributed feedback (DFB) lasers, or with vertical-cavity surface emitting lasers (VCSELs), or with light emitting diodes (LEDs) rather than lasers. Further, if laser diodes 142, 152, ... 162 and laser diodes 144, 154, ... 164 are selected to generate optical signals of differing wave lengths responsive to the current signals of the laser diode drivers 112, 122, ... 132, then techniques, such as wave division multiplexing (WDM) for example, may be used to increase the capacity and reduce the number and/or cost of the optical fibers or other wave guide channels connecting transmitters and receivers.

Figure 2:
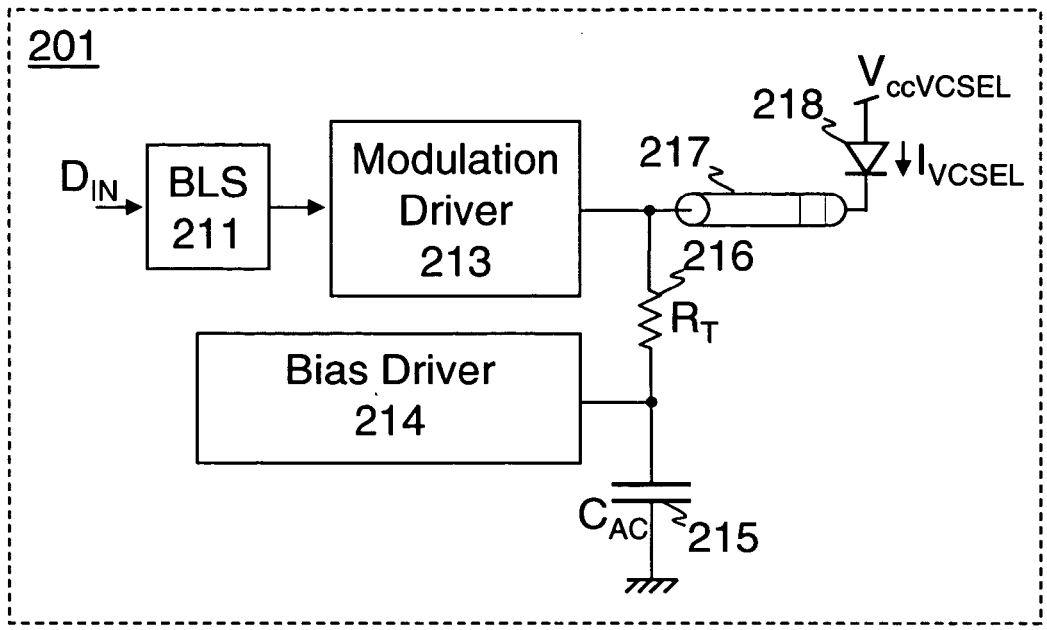
FIG. 2 illustrates an embodiment of a driver circuit.

FIG. 2 illustrates an embodiment of a laser driver circuit 201 including a buffered level shifter circuit 211 to shift an input voltage level of modulation driver 213 to a first voltage level to generate a current of a modulation mode and to shift the input voltage level of bias driver 214 to a second voltage level to generate a current of a bias mode. For one embodiment, modulation driver 213 generates a 1-20 mA alternating current (AC) in modulation mode to represent a logical one (1) and bias driver 214 generates a 1-10 mA direct current (DC) in bias mode to represent a logical zero (0).

In the example embodiment of FIG. 2, a VCSEL laser diode 218 being driven by laser driver circuit 201 is anticipated to operate up to approximately 5-15 GHz or more producing data rates up to approximately 10-30 Gbps or more. In alternate embodiments, laser driver circuit 201 may also provide for modulation and/or bias mode adjustment, for example, for temperature variations, and may be useful to drive high speed DBF lasers, or FP lasers, or even LEDs at lower speeds.

Capacitor 215 may be a metal oxide semiconductor (MOS) capacitor coupled with bias driver 214 to reduce alternating current (AC) effects. In one embodiment, the capacitance value may be chosen as approximately 1 nF for capacitor 215. In one embodiment, the impedance value of package trace 217 may be approximately 50 Ω and so the resistive value may be chosen as approximately 50 Ω for resistor 216. Resistor 216 may be adjustable in some embodiments and may comprise, for example, one or more MOS field-effect transistors (MOSFETs).

Figure 3:
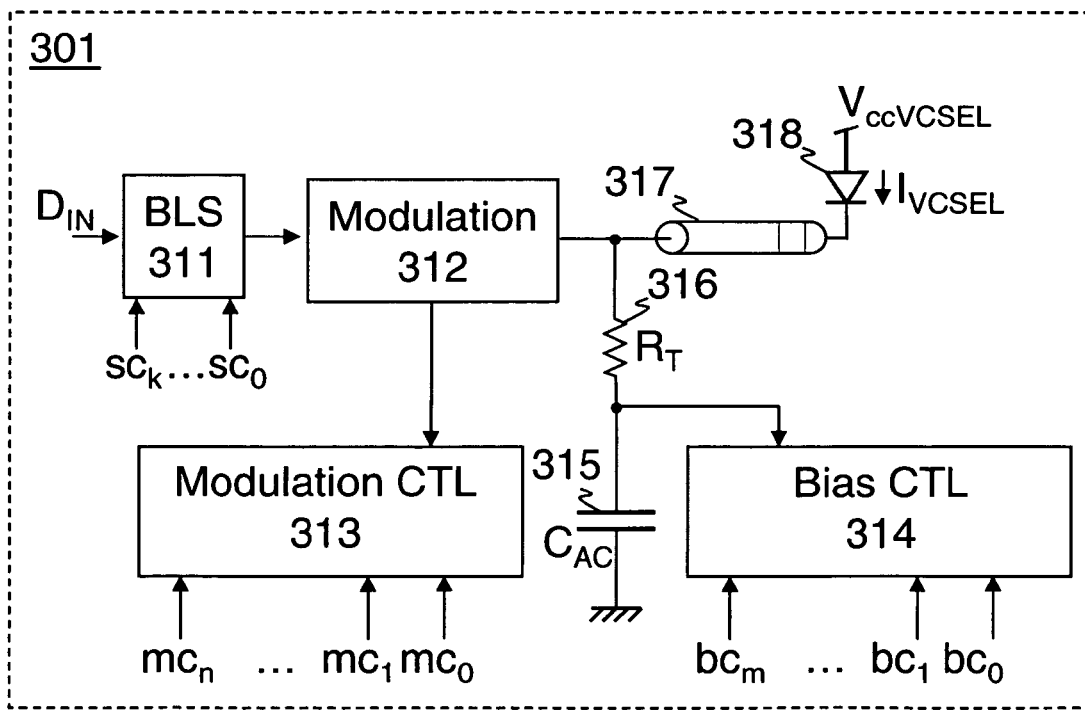
FIG. 3 illustrates an alternative embodiment of a driver circuit.

FIG. 3 illustrates one alternative embodiment of a laser driver circuit 301 including a buffered level shifter circuit 311 tunable through k+1 control inputs to shift an input voltage level of modulation circuit 312 to a first voltage level to generate a current of a modulation mode and to shift the input voltage level of modulation circuit 312 to a second voltage level to generate a current of a bias mode. Details of embodiments of the buffered level shifter circuit 311 are discussed further below, especially with respect to FIGS. 4a and 4b.

Some embodiments of laser diode driver circuit 301 include a modulation control circuit 313 adjustable through up to n+1 control inputs to control generation of the current in modulation mode responsive to the input voltage level being shifted to the first voltage level. Some embodiments of laser diode driver circuit 301 include a bias control circuit 314 adjustable through up to m+1 control inputs to control generation of the current in bias mode responsive to the input voltage level being shifted to the second voltage level. Details of embodiments of the modulation circuit 312, modulation control circuit 313 and bias control circuit 314 are discussed further below, especially with respect to FIGS. 6a and 6b.

In one embodiment, the resistive value for resistor 316 may be chosen so to substantially match the impedance of package trace 317. A capacitance 315 may also be coupled with the bias control circuit 314. In some embodiments of laser diode driver circuit 301, an array of capacitors 501 is coupled with the bias control circuit 314 to reduce the AC component effects of the bias mode current. In one embodiment, the total capacitance value may be chosen as approximately 1 nF or less for capacitor 315. Details of the array of capacitors 501 are discussed further below, especially with respect to FIG. 5.

VCSEL laser diode 318 is being driven by a current $I_{VCSEL}$ of laser driver circuit 301, but in alternate embodiments, laser driver circuit 301 may be used to drive other types of lasers or LEDs.

Figure 4A:
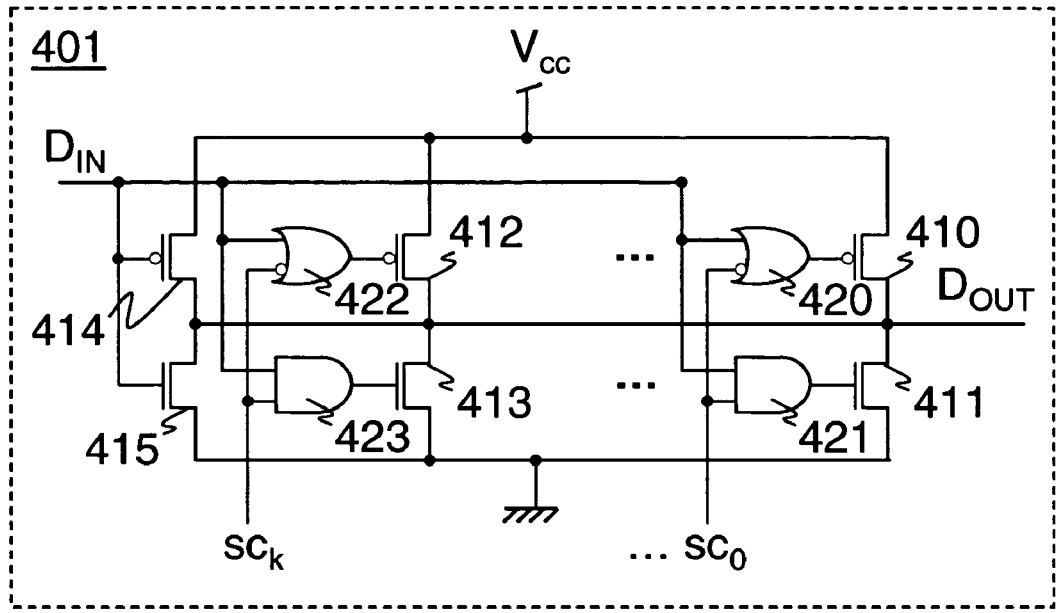
FIG. 4a illustrates an embodiment of a buffed level shifter for use in a driver circuit.

FIG. 4a illustrates an embodiment of a buffed level shifter 401 for use in a laser driver circuit or other light emitting device driver. Buffered level shifter circuit 401 is tunable through k+1 control inputs to shift an input voltage level of a modulation circuit to a controlled voltage level at a controlled rate and with adjustable impedance. For example, responsive to a transitioning input, $D_{IN}$, the inverter formed by pMOSFET 414 and nMOSFET 415 begins shifting the voltage level of $D_{OUT}$ in the opposite direction. If the control input, $cs_0$, is set, then the transitioning input gated by gates 420 and 421 is propagated to the inverter formed by pMOSFET 410 and nMOSFET 411, which assists with shifting the voltage level of $D_{OUT}$ in the opposite direction of transitioning input, $D_{IN}$. Similarly if any of the control inputs up to and including $cs_k$ are set, then the transitioning input gated by corresponding pairs of gates up to and including 422 and 423 is propagated to their corresponding inverters up to and including the inverter formed by pMOSFET 412 and nMOSFET 413, which assist with shifting the voltage level of $D_{OUT}$ in the opposite direction of the transitioning input, $D_{IN}$.

For one embodiment of a buffed level shifter 401, devices of the inverter formed by pMOSFET 410 and nMOSFET 411 up to and including the inverter formed by pMOSFET 412 and nMOSFET 413 may be sized in conveniently selected multiples, for example, powers of two (1×, 2×, 4×, etc.) to facilitate more precise tuning of the voltage level, rate and impedance through the k+1 control inputs.

Figure 4B:
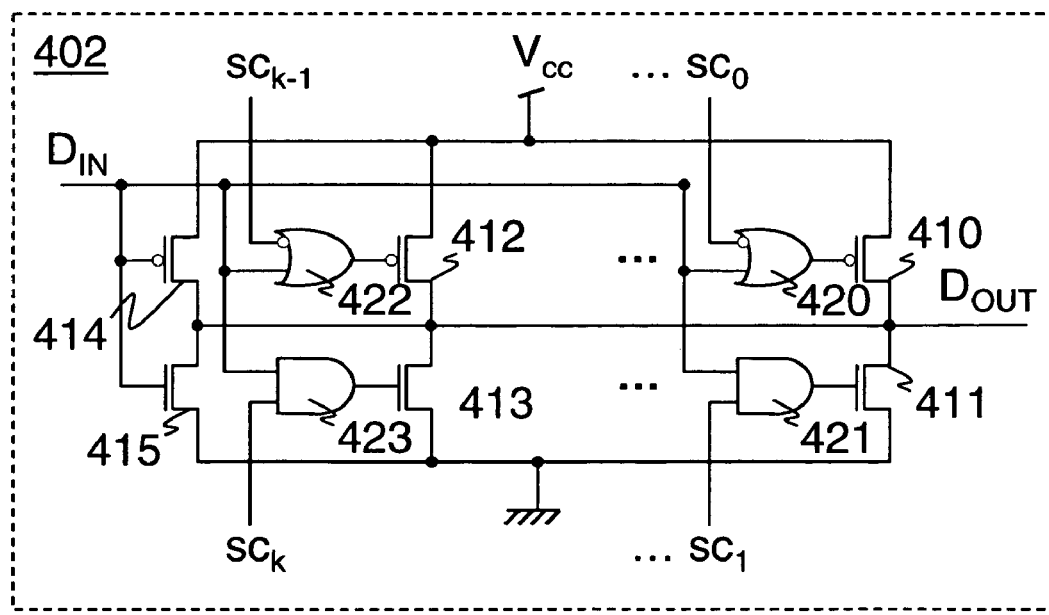
FIG. 4b illustrates an alternative embodiment of a buffed level shifter for use in a driver circuit.

FIG. 4b illustrates an alternative embodiment of a buffed level shifter 402 for use in a laser driver circuit or other light emitting device driver. Buffered level shifter circuit 402 is tunable through k+1 control inputs to shift an input voltage level of a modulation circuit to a controlled voltage level at a controlled rate and with adjustable impedance. For example, responsive to a transitioning input, $D_{IN}$, the inverter formed by pMOSFET 414 and nMOSFET 415 begins shifting the voltage level of $D_{OUT}$ in the opposite direction. If any of the even control inputs, $cs_0$, up to and including $cs_{k-1}$ are set, then the transitioning input gated by corresponding gates from 420 up to and including 422 is propagated to a corresponding pMOSFET 410 up to and including 412, which assist with shifting the voltage level of $D_{OUT}$ toward $V_{CC}$ when the input, $D_{IN}$, is transitioning in the opposite direction (away from $V_{CC}$). If any of the odd control inputs, $cs_1$, up to and including $cs_k$ are set, then the transitioning input gated by corresponding gates from 421 up to and including 423 is propagated to a corresponding nMOSFET 411 up to and including 413, which assist with shifting the voltage level of $D_{OUT}$ away from $V_{CC}$ when the input, $D_{IN}$, is transitioning in the opposite direction (toward $V_{CC}$). Therefore in buffed level shifter 402, control inputs for pMOSFET devices 410 up to and including 412 and for nMOSFET 411 up to and including 413 may be set to tune the voltage levels, transition rates and impedances independently for rising and falling transitions through the k+1 control inputs.

It will be appreciated that the buffered level shifter may be modified in arrangement and detail by those skilled in the art without departing from the principles of the present invention, for example, being realized as another type of tunable segmented driver or alternatively as a conventional inverter array.

Figure 5:
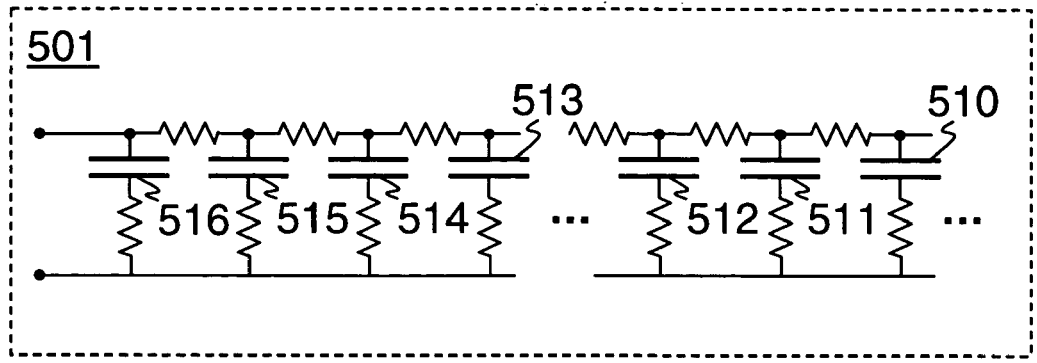
FIG. 5 illustrates an embodiment of an array of capacitors for use in a driver circuit.

FIG. 5 illustrates an embodiment of an array of capacitors 501 for use in a laser driver circuit or other light emitting device driver. In order to reduce the series resistance introduced by a large capacitor, capacitor 215 or 315 may be partitioned into hundreds of small MOS capacitors 510, 511, ... 516 and arrayed as shown in FIG. 5. Thus the series resistance realized may be negligible when compared with the termination resistance, for example, of approximately 50 Ω for resistor 216.

Figure 6A:
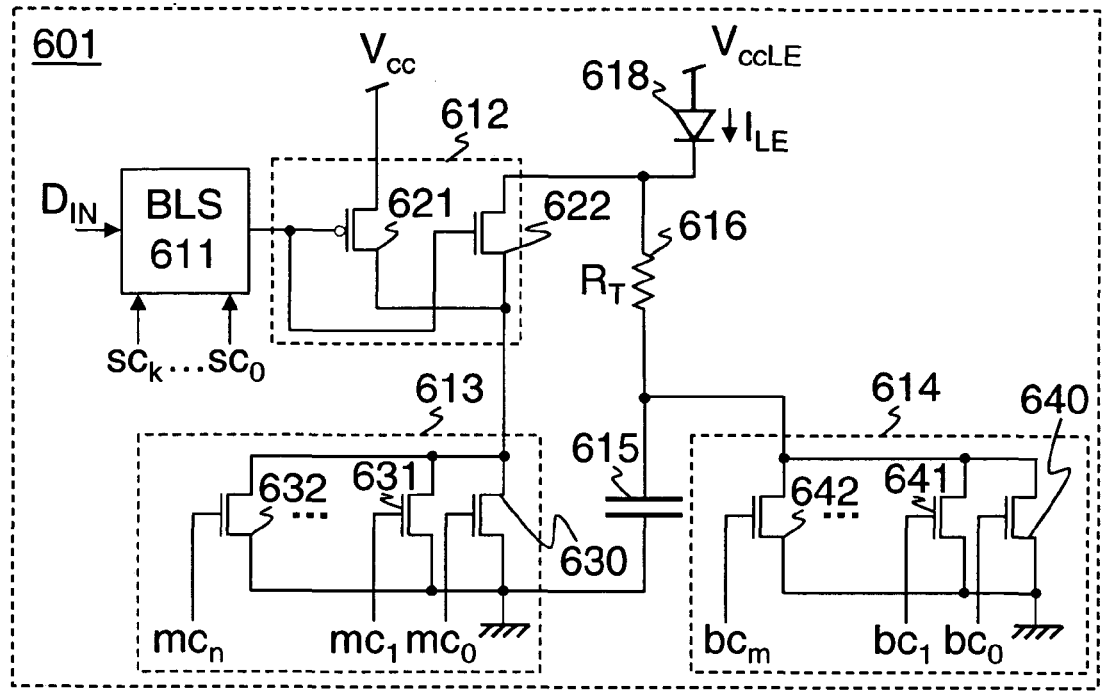
FIG. 6a illustrates another alternative embodiment of a driver circuit.

FIG. 6a illustrates another alternative embodiment of a diode driver circuit 601 for a laser or an LED including a buffered level shifter circuit 611 tunable through k+1 control inputs to shift an input voltage level of modulation circuit 612 to a first voltage level to generate a current of a modulation mode and to shift the input voltage level of modulation circuit 612 to a second voltage level to generate a current of a bias mode.

For some embodiments of driver circuit 601, a CMOS modulation circuit 612 causes current, $I_{LE}$, of the modulation mode to flow from the $V_{ccLE}$ source through nMOSFET 622 responsive to the input voltage level being shifted to the first voltage level. Modulation circuit 612 causes a current to flow from the $V_{cc}$ source through pMOSFET 621 and current, $I_{LE}$, of the bias mode to flow from the $V_{ccLE}$ source through resistor 616 responsive to the input voltage level being shifted to the second voltage level.

Diode driver circuit 601 includes a modulation control circuit 613 adjustable through up to n+1 control inputs to control generation of the current in modulation mode responsive to the input voltage level being shifted to the first voltage level. Diode driver circuit 601 also includes a bias control circuit 614 adjustable through up to m+1 control inputs to control generation of the current in bias mode responsive to the input voltage level being shifted to the second voltage level.

For some embodiments of a modulation control circuit 613, nMOSFET 630 and/or nMOSFET 631 up through nMOSFET 632 may be sized in conveniently selected multiples, for example, powers of two (1×, 2×, 4×, etc.) to facilitate more precise adjustment of the current in modulation mode through the n+1 control inputs, $mc_0, mc_1, \ldots mc_n$. For some embodiments of a bias control circuit 614, nMOSFET 640 and/or nMOSFET 641 up through nMOSFET 642 may be sized in conveniently selected multiples to facilitate more precise adjustment of the current in bias mode through the m+1 control inputs, $bc_0, bc_1, \ldots bc_m$. It will be appreciated that any or all of the control inputs for modulation control circuit 613 and/or bias control circuit 614 may come from a central control unit or self adaptive control circuit(s).

In one embodiment, the resistive value for resistor 616 may be chosen so to substantially match a package trace imped-ance. Capacitor 615 may also be coupled with the bias control circuit 614 to reduce the AC component effects of the bias mode current.

Light emitter 618 may represent a VCSEL laser diode, or a DBF laser diode, or a multi-quantum well (MQW) or buried hetero (BH) or other style of FP laser diode, or an edge- or surface-emitting LED being driven by a current $I_{LE}$ of driver circuit 601.

Figure 6B:
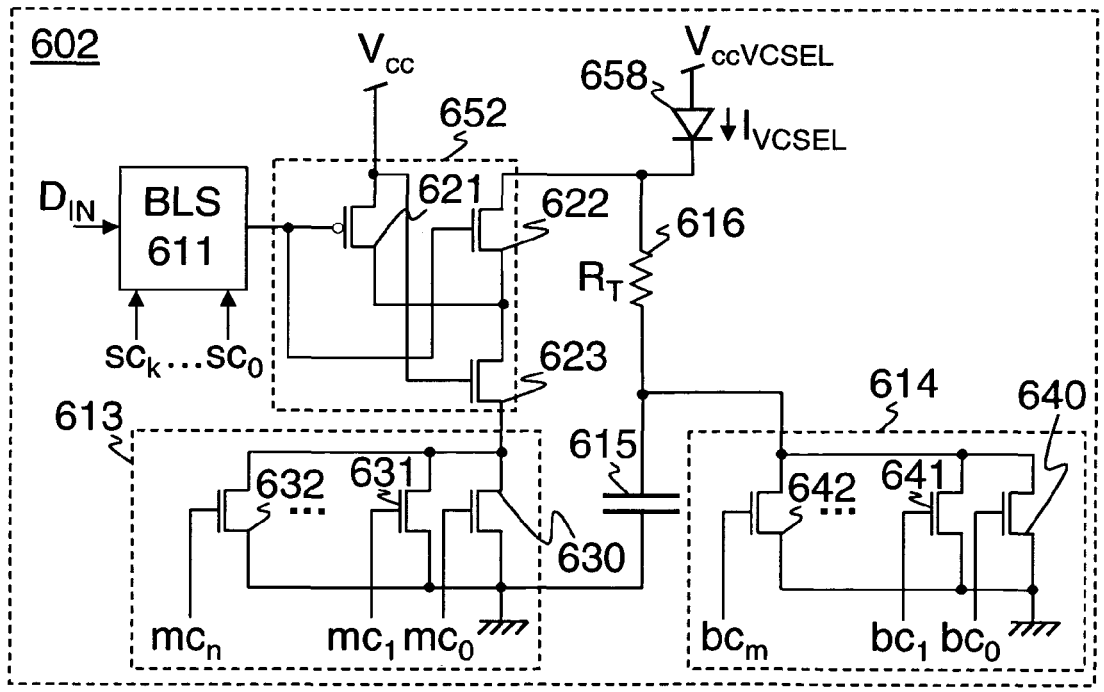
FIG. 6b illustrates another alternative embodiment of a driver circuit.

FIG. 6b illustrates another alternative embodiment of a VCSEL laser diode driver circuit 602 including tunable buffered level shifter circuit 611 to shift the input voltage level of modulation circuit 652 to a first voltage level to generate a current of a modulation mode and to shift the input voltage level of modulation circuit 652 to a second voltage level to generate a current of a bias mode.

For some embodiments of driver circuit 602, a CMOS modulation circuit 652 causes current, $I_{VCSEL}$, of the modulation mode to flow from the $V_{ccVCSEL}$ voltage source through nMOSFET 622 and nMOSFET 623 responsive to the input voltage level being shifted to the first voltage level. Modulation circuit 652 causes a current to flow from the $V_{cc}$ source through pMOSFET 621 and current, $I_{VCSEL}$, of the bias mode to flow from the $V_{ccVCSEL}$ source through resistor 616 responsive to the input voltage level being shifted to the second voltage level. For some embodiments of modulation circuit 652, the input gate of nMOSFET 623 may be coupled with the $V_{cc}$ source or some other source voltage to reduce current overshoot of $I_{VCSEL}$.

Driver circuit 602 includes adjustable modulation control circuit 613 to control generation of the current in modulation mode responsive to the input of the first voltage level and adjustable bias control circuit 614 to control generation of the current in bias mode responsive to the input of the second voltage level.

Modulation control circuit 613 provides for adjustment of the current in modulation mode through nMOSFET 630 and/or nMOSFET 631 up through nMOSFET 632 and the corresponding n+1 control inputs, $mc_0, mc_1, \ldots mc_n$. Bias control circuit 614 provides for adjustment of the current in bias mode through nMOSFET 640 and/or nMOSFET 641 up through nMOSFET 642 and the corresponding m+1 control inputs, $bc_0, bc_1, \ldots bc_m$. Control inputs for modulation control circuit 613 and/or bias control circuit 614 may come from a central control unit or self adaptive control circuit(s).

The resistive value for resistor 616 may be chosen so to substantially match a package trace impedance. Capacitor 615 may be coupled with bias control circuit 614 to reduce the AC component effects of the bias mode current. VCSEL laser diode 658 is being driven by a current $I_{VCSEL}$ of driver circuit 602, but in alternate embodiments, driver circuit 602 may be used to drive other types of lasers or LEDs.

FIG. 7 illustrates an embodiment at the circuit level of a transimpedance amplifier 701 driven by a photo-detector current source 745 and capacitor 746. The amplifier of FIG. 7 provides a differential output voltage $\{V_{OUT}, \overline{V}_{OUT}\}$ at output ports 718 and 719. Ideally, under noiseless conditions these voltages may be written as $V_{OUT}=v+V_0$ and $\overline{V}_{OUT}=-v+V_0$, where v is a small-signal voltage and $V_0$ a voltage between ground and supply voltage $V_{DD}$. In some embodiments, $V_0=V_{DD}/2$. (If the two supply voltages are $V_{DD}$ and $V_{SS}$ rather than $V_{DD}$ and ground, then clearly $V_{DD}>V_0>V_{SS}$.) Ideally, the small-signal voltage v is proportional to the small-signal photo-detector current $I_{PD}$.

It is expected that noise due to power supply and substrate coupling will be equally present in both voltages $V_{OUT}$ and $\overline{V}_{OUT}$. The differential voltage $\{V_{OUT}, \overline{V}_{OUT}\}$ may be further amplified by differential post-amplifiers. Differencing the two components of the differential voltage {$V_{OUT}$, $\overline{V}_{OUT}$}, or differencing its differential amplification, subtracts out much of the noise. In this way, it is expected that the embodiment of FIG. 7 has utility in noisy environments.

The amplifier of FIG. 7 has three stage pairs. Each pair has two inverter amplifiers. The first pair of stages has a first inverter comprising pMOSFET 710 and nMOSFET 712, and a second inverter comprising pMOSFET 711 and nMOSFET 713. Resistor 714 provides negative feedback for the first inverter pMOSFET 710 and nMOSFET 712, and resistor 715 provide negative feedback for the second inverter pMOSFET 711 and nMOSFET 713. These inverter amplifiers are matched. That is, pMOSFETs 710 and 711 are matched to each other, i.e., they have the same betas, nMOSFETs 712 and 713 are matched to each other, and resistors 714 and 715 have the same resistance value.

Each of the inverter amplifiers with negative feedback in the first stage pair is seen to be a simple transimpedance amplifier, where under reasonable assumptions the low frequency transimpedance is the resistance of resistor 714 for the first inverter amplifier and 715 for the second inverter amplifier. These resistors also set the bias levels of the pMOSFETs and nMOSFETs in the first stage pair so that the inverter amplifiers operate in their linear high gain region, and resistor 714 also provides a current path for the photo-detector.

The first inverter amplifier in the first stage pair has its input port 716 connected to the photo-detector. However, input port 717 is connected to an impedance matching capacitor 747 having the same capacitance as photo-detector capacitor 746 for differential impedance matching. It will be appreciated that photo-detector capacitor 746 may represent the inherent capacitance of a combined package trace and photo-detector current source 745. More generally, input port 717 should be loaded by the same impedance as seen by input port 716 looking into the photo-detector, or whatever source is driving the amplifier.

The second (or middle) stage pair in the embodiment of FIG. 7 has two inverter amplifiers, the first inverter amplifier comprises pMOSFET 720 and nMOSFET 722, and the second inverter amplifier comprises pMOSFET 721 and nMOSFET 723. Resistor 725 provides feedback from output port 736 of the first inverter amplifier in the second stage pair to input port 727 of the second inverter amplifier in the second stage pair. Resistor 724 provides feedback from output port 737 of the second inverter amplifier in the second stage pair to input port 726 of the first inverter amplifier in the second stage pair. The first and second inverter amplifiers in the second stage pair are matched to each other, and the resistors 724 and 725 have the same resistance.

The third stage pair in the embodiment of FIG. 7 is identical in structure to the first stage pair. However, although resistors 728 and 729 are matched to each other, i.e., they have the same resistance, they need not necessarily have the same resistance as resistors 714 and 715. Similarly, although pMOSFETs 730 and 731 are matched to each other, they are not necessarily matched to pMOSFETs 710 and 711. A similar statement applies to nMOSFETs 732 and 733. The inverters with negative feedback used in the first and second stage pairs of FIG. 7 may be referred to as shunt-shunt feedback amplifier stages.

By employing resistive cross coupling (resistors 724 and 725) between the two inverter amplifiers in the second stage pair, the signal is complementary coupled while the resistive network helps to attenuate common noise That is, the signal is coupled through resistive voltage dividers while the common noise is attenuated. (Resistors 714 and 724 form one of the voltage dividers, and resistors 715 and 725 form the other one.) The coupling intensity and common mode noise attenuation depend on the value of the resistors 724 and 725 relative to the feedback resistors 714 and 715 and the feedback resistors 728 and 729. In one embodiment, the resistive values may be chosen as 200Ω for resistors 714 and 715, 100 Ω for resistors 724 and 725, and 300 Ω for resistors 728 and 729. These resistive values are meant to represent relative ratios of resistive values, so that the resistors may be scaled to maintain these relative ratios.

Various modifications may be made to the disclosed embodiments without departing from the scope of the invention as claimed below. For example, other resistive feedback elements may be used in place of the resistors in FIG. 7. As one example, pMOSFETs may be used. In other embodiments, nMOSFETs may be used, or various combinations of different resistive feedback elements may be used. Optionally, additional post amplification circuitry may typically amplify the differential voltage outputs of transimpedance amplifier 701 to a digital voltage swing suitable for input to subsequent processing blocks, for example, comprising sampler and/or deserializer circuitry.

Figure 8:
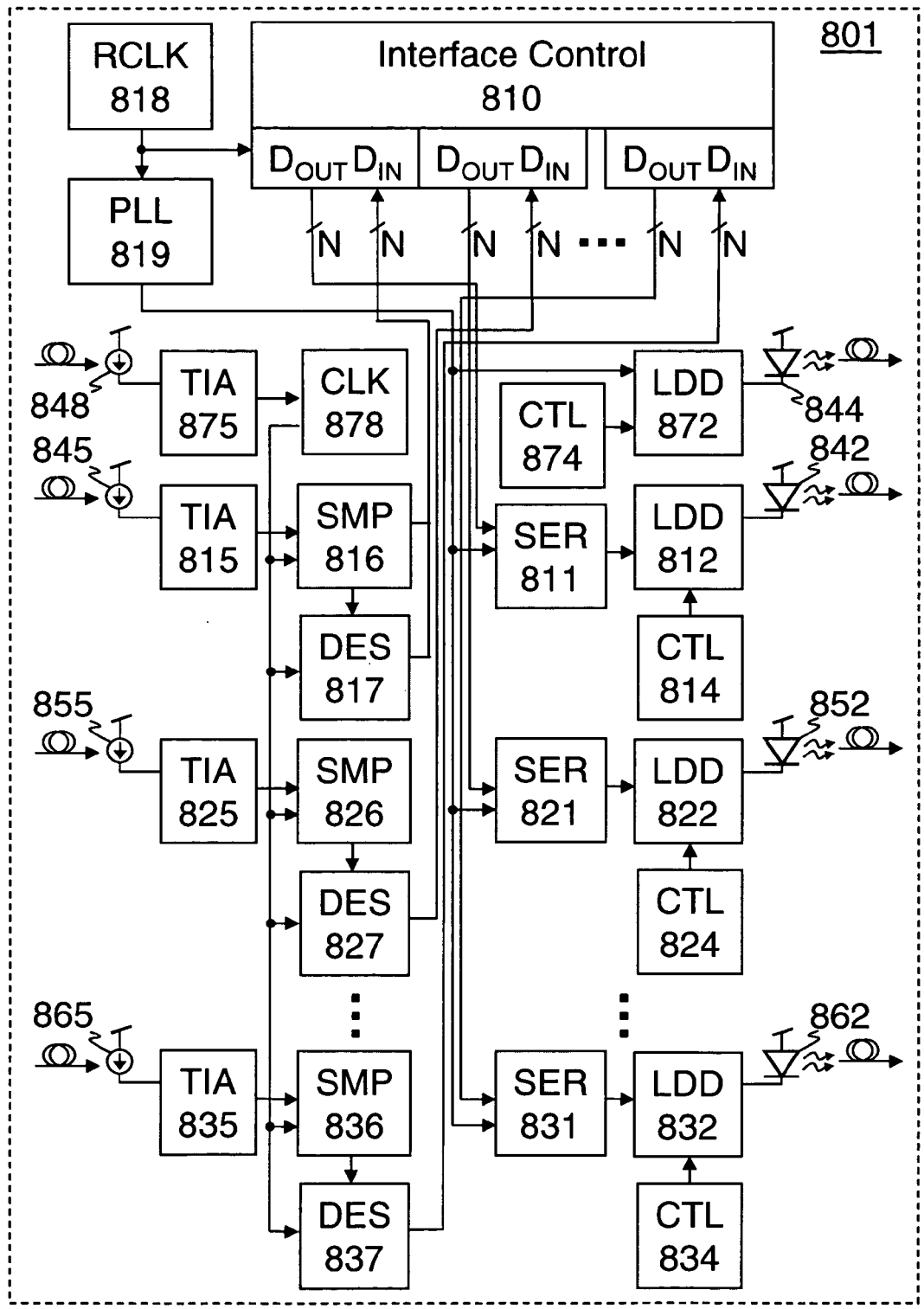
FIG. 8 illustrates another alternative embodiment of an optical signaling system.

FIG. 8 illustrates another alternative embodiment of an optical signaling system 801 comprising an interface control 810 to interface with devices (not shown) for transmission and reception of data via optical signaling system 801, and a phase locked loop (PLL) circuit 819 to generate a clock signal from reference clock 818. Optical signaling system 801 also comprises serializer circuits 811, 821, . . . 831, each to receive the clock signal from PLL circuit 819 and to convert data from interface control 810 to a digital voltage input sequence for laser diode drivers 812, 822, . . . 832 respectively. Laser diode driver circuits 812, 822, . . . 832 are respectively coupled with control circuitry 814, 824, . . . 834, each comprising a bias control circuit and/or a modulation control circuit. Each of the laser diode driver circuits 812, 822, . . . 832 may receive a digital voltage input sequence and generate a corresponding current signal having a bias mode adjustable by their respective bias control circuit and a modulation mode adjustable by their respective modulation control circuit.

Laser diodes 842, 852, . . . 862 respectively generate optical signals responsive to the current signals of the laser diode drivers 812, 822, . . . 832. Laser diode driver circuit 872 may also generate a corresponding current signal for one clock signal from PLL circuit 819 from which laser diode 844 may generate an optical clock signal. The optical signals from laser diodes 842, 852, . . . 862 and laser diode 844 are transmitted, for example, through optical fibers or wave guides to optical receiving devices.

Photo-detectors 845, 855, . . . 865 and 848 are optically coupled to means for receiving optical data signals, for example, optical fibers or wave guides, and generate single-ended data signals and a single-ended clock signal in transimpedance amplifier circuits 815, 825, . . . 835 and 875 respectively. Laser diodes 842, 852, . . . 862 and 844 and photo-detectors 845, 855, . . . 865 and 848 may also be directionally coupled, for example, to a duplex bus. For some embodiments of optical signaling system 801, each of the transimpedance amplifier circuits 815, 825, . . . 835 and 875 may convert these single ended current signals to differential voltage signals.

Clock recovery circuit 878 may receive differential clock signals from the transimpedance amplifier circuit 875, recover and provide clock signals to the sampler circuits 816, 826, . . . 836, and the deserializer circuits 817, 827, . . . 837. Clock recovery circuit 878 may have a phase interpolator to generate an aligned clock signal for the differential data signals. Details of the clock recovery circuits 878 are discussed further below with respect to FIG. 9.

Sampler circuits 816, 826, . . . 836 generate digital voltage sequences responsive at least in part to the aligned clock signal of clock recovery circuits 878 and their corresponding differential data signals. Deserializer circuits 817, 827, . . . 837 receive these digital voltage sequences from the sampler circuits 816, 826, . . . 836, and respectively convert them into N-bit data to be provided to interface control 810.

Figure 9:
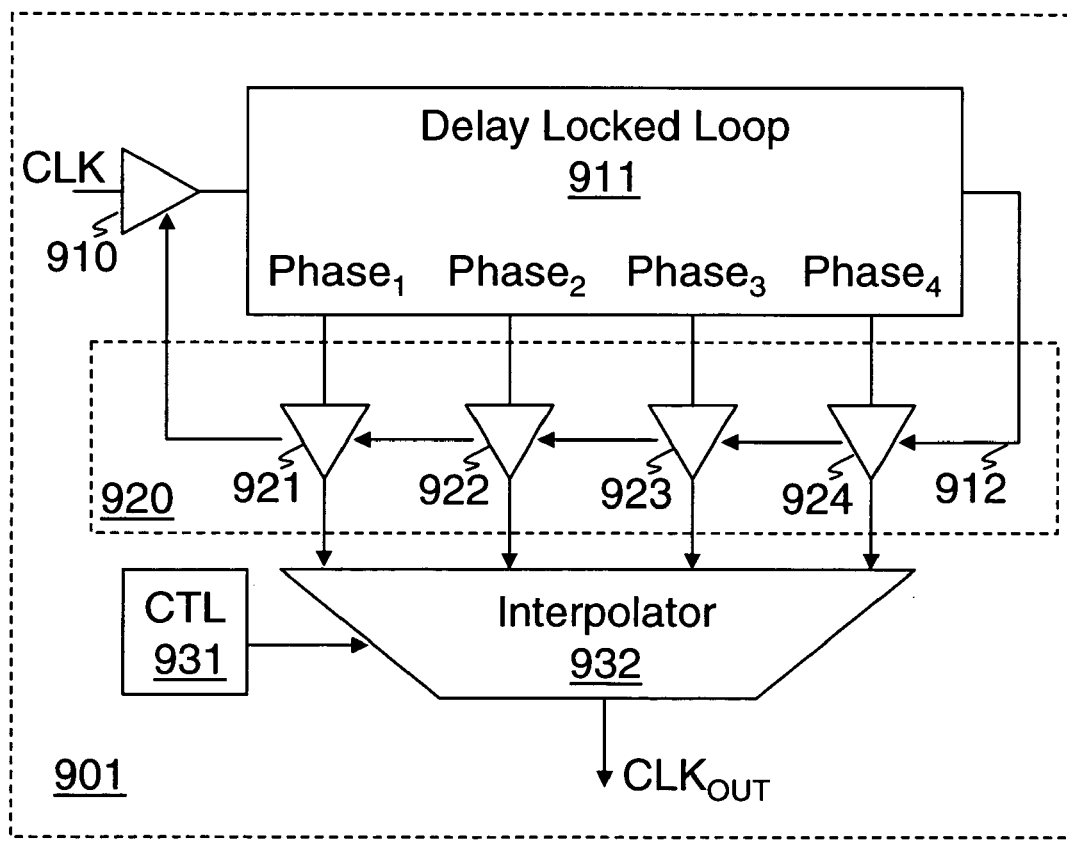
FIG. 9 illustrates an embodiment of a clock recovery circuit for use in an optical receiver.

FIG. 9 illustrates an embodiment of a clock recovery circuit 901 for use in an optical receiver. Some embodiments of lock recovery circuit 901 comprise a delay locked loop (DLL) 911 and a phase interpolator 932 to generate an aligned clock signal from the reference clock signal received from an optical channel. In operation, the reference clock signal, CLK, is input to DLL 911. DLL 911 may generate multiple equally-delayed differential signals. These multiple equally-delayed differential signals may be buffered by clock buffering circuitry 920 for input to phase interpolator 932. Clock buffering circuitry 920 comprises controlled delay elements 921-924. The delays of controlled delay elements 921-924 along with controlled delay element 910 may be adjusted by DLL 911 control voltage(s). The phase interpolator 932 aligns the edges of the aligned clock signal, $CLK_{OUT}$, with a data stream center in a much higher resolution.

Figure 10:
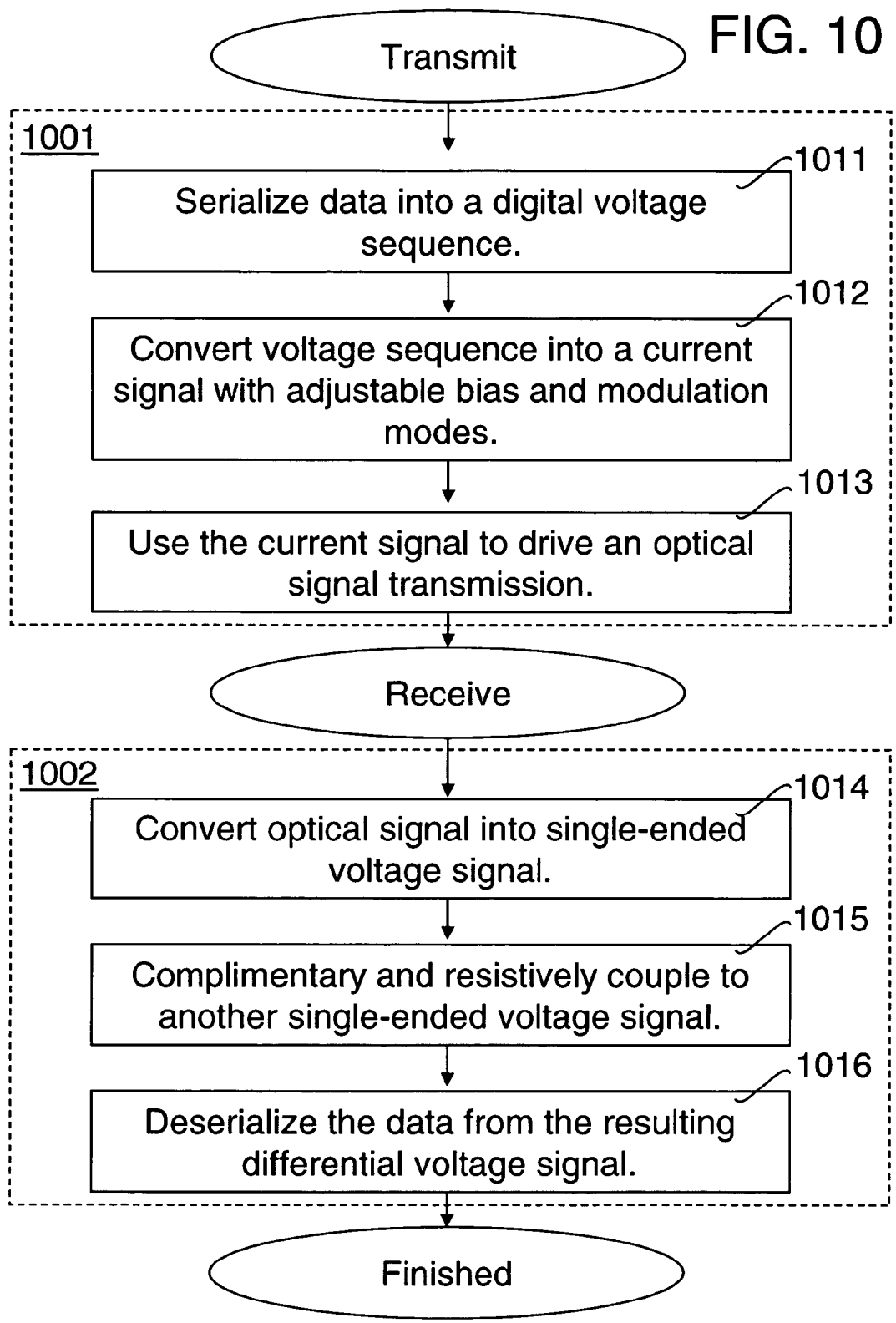
FIG. 10 illustrates a flow diagram for embodiments of processes to transmit and receive optical signals.

FIG. 10 illustrates a flow diagram for one embodiment of a process 1001 to transmit and a process 1002 to receive optical signals. Processes 1001 and 1002 and other processes herein disclosed are performed by processing blocks that may comprise dedicated hardware or software or firmware operation codes executable by general purpose machines or by special purpose machines or by a combination of both.

Transmitting begins in processing block 1011 where an N-bit data is serialized to generate a digital voltage sequence. Processing continues in processing block 1012 where the digital voltage sequence is converted to a first current signal having an adjustable bias mode and an adjustable modulation mode, for example as described above with reference to FIGS. 3, 6a and 6b. In processing block 1013, a laser diode or light emitting diode is driven using the first current signal to generate an optical signal transmission.

Receiving begins in processing block 1014 where an optical signal reception is converted by a photo detector into a first single-ended voltage signal. In processing block 1015, the first single-ended voltage signal and a second single-ended voltage signal are complimentary and resistively coupled, for example as described above with reference to FIG. 7, to generated a differential voltage signal to attenuate common signal noise. Finally, in processing block 1016, the differential voltage signal is sampled and deserialized to generate the transmitted data.

It will be appreciated that while both transmission and reception of optical signals may occur in a single device, the data being transmitted by one device may typically be received by another device.

Figure 11:
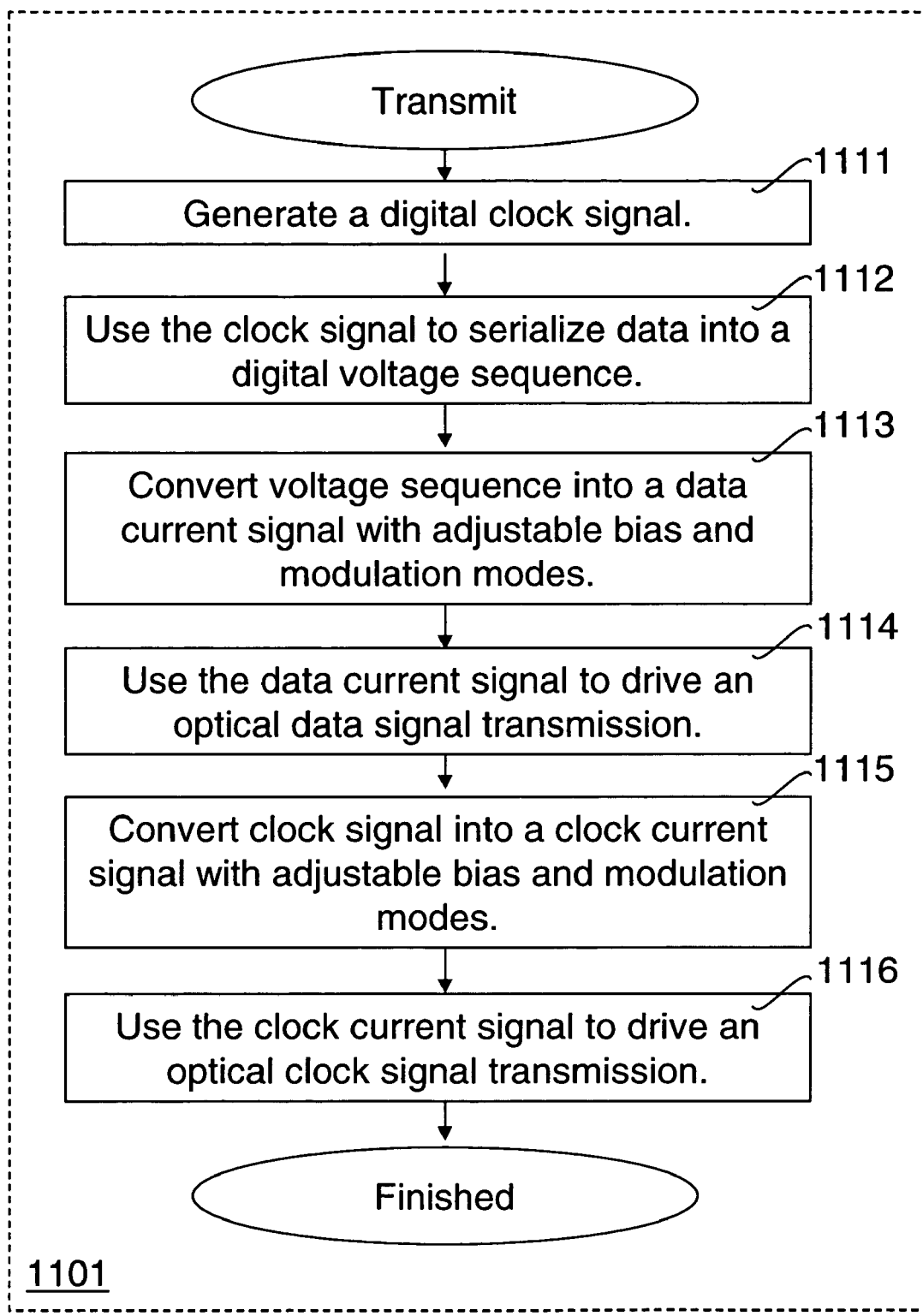
FIG. 11 illustrates a flow diagram for one alternative embodiment of a process to transmit optical signals.

FIG. 11 illustrates a flow diagram for one alternative embodiment of a process 1101 to transmit optical signals. Transmitting begins with processing block 1111 where a digital clock signal is generated. In processing block 1112 an N-bit data is serialized using the digital clock signal to generate a digital voltage sequence. Processing continues in processing block 1113 where the digital voltage sequence is converted to a data current signal having an adjustable bias mode and an adjustable modulation mode. In processing block 1114, a laser diode or light emitting diode is driven using the data current signal to generate an optical data signal transmission. In processing block 1115, the digital clock signal is converted to a clock current signal having an adjustable bias mode and an adjustable modulation mode. Processing continues in processing block 1116 where a laser diode or light emitting diode is driven using the clock current signal to generate an optical clock signal transmission.

It will be appreciated that one or more of the processing blocks of process 1001, 1002, 1101 and/or 1102 may be executed in parallel or concurrently or out of the order depicted without departing from the principles of the present invention. For example, it would be anticipated that transmitting of process 1001 and receiving of process 1002 may occur in various orders within a system including in parallel or concurrently or out of the order depicted; or that processing blocks 1113-1116 may be executed in parallel or concurrently or out of the order depicted. Therefore the drawings are to be regarded in an illustrative rather than a restrictive sense.

Figure 12:
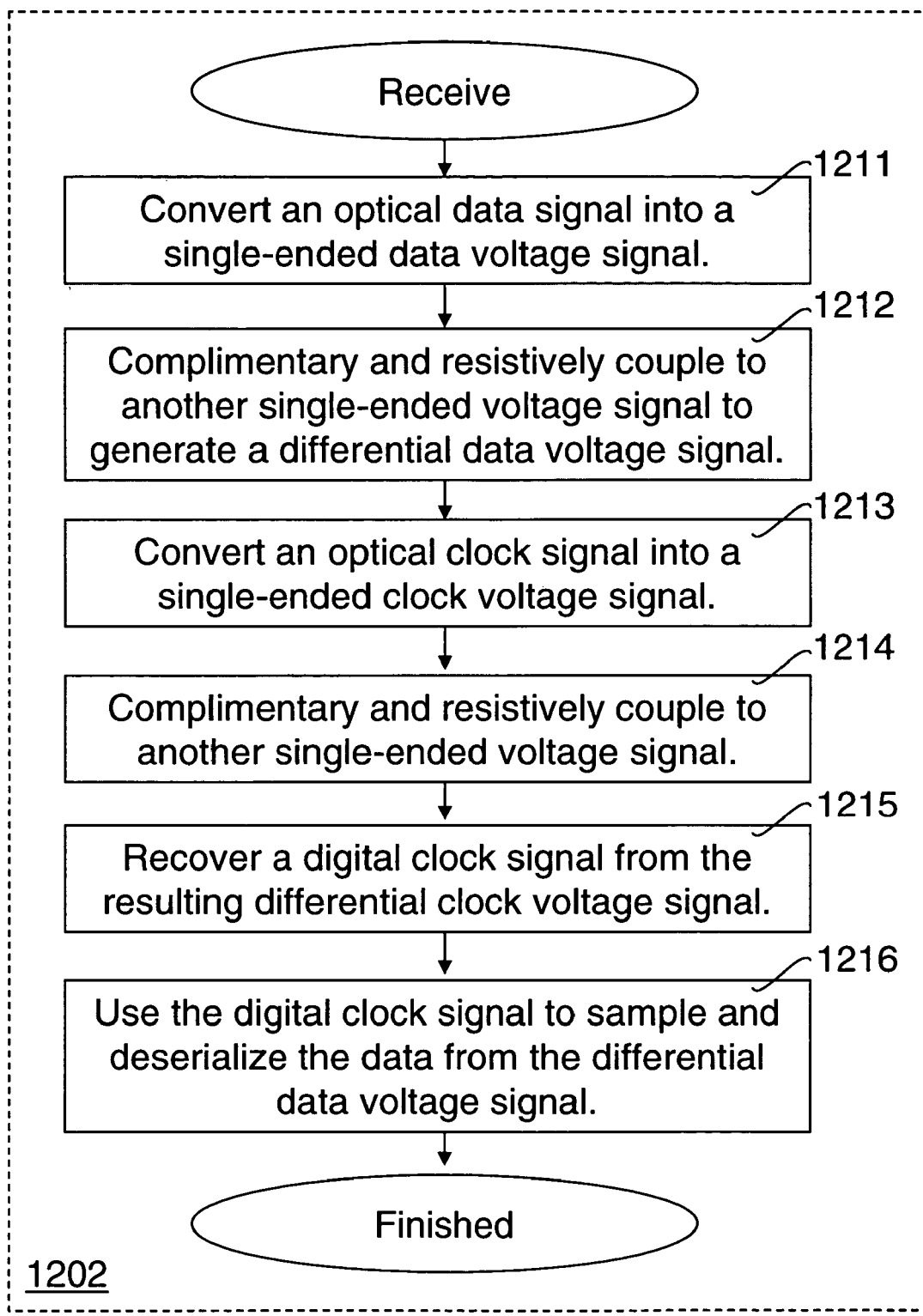
FIG. 12 illustrates a flow diagram for one alternative embodiment of a process to receive optical signals

FIG. 12 illustrates a flow diagram for one alternative embodiment of a process to receive optical signals. Receiving begins in processing block 1211 where an optical data signal reception is converted by a photo detector into a single-ended data voltage signal. Processing continues in processing block 1212 where the single-ended data voltage signal and another single-ended voltage signal are complimentary and resistively coupled to generated a differential voltage signal and to attenuate common signal noise. In processing block 1213 an optical clock signal reception is converted by a photo detector into a single-ended clock voltage signal. Processing continues in processing block 1214 where the single-ended clock voltage signal and another single-ended voltage signal are complimentary and resistively coupled to generated a differential clock voltage signal and to attenuate common signal noise. In processing block 1215 a digital clock signal is recovered from the differential clock signal, for example, using a DLL and a phase interpolator. Finally, using the digital clock signal in processing block 1216, the differential data voltage signal is sampled and deserialized to generate the transmitted data.

Thus, processes using integrated high speed optical I/O circuitry may provide very high bandwidth digital interconnects.

The above description is intended to illustrate preferred embodiments of the present invention. From the discussion above it should also be apparent that especially in such an area of technology, where growth is fast and further advancements are not easily foreseen, the invention may be modified in arrangement and detail by those skilled in the art without departing from the principles of the present invention within the scope of the accompanying claims and their equivalents.

What is claimed is:
1. An optical receiver comprising:
  a first photo-detector to receive a first optical signal and to generate a first current signal;
  a first transimpedance amplifier circuit to convert the first current signal to a first differential voltage signal, wherein the first transimpedance amplifier circuit is configured to produce a differential voltage and is further configured to difference the components of the differential voltage to produce said first differential voltage signal wherein the first transimpedance amplifier comprises three stage pairs, where each pair comprises two inverter amplifiers, and where the two inverter amplifiers of the second stage pair are resistively cross coupled;
  a clock recovery circuit having a phase interpolator to generate an aligned clock signal for said first differential voltage signal;

a sampler circuit to receive the aligned clock signal and to receive the differential voltage signal and to generate a digital voltage sequence; and a deserializer circuit to receive the digital voltage sequence and to generate an N-bit data.

2. The optical receiver of claim 1 further comprising:

a second photo-detector to receive a second optical signal and to generate a second current signal;

a second transimpedance amplifier circuit to convert the second current signal to a differential clock signal;

said clock recovery circuit having said phase interpolator to generate the aligned clock signal for said first differential voltage signal from the differential clock signal.

3. The optical receiver of claim 2 further comprising:

a delay locked loop to generate a plurality of clock phases from the differential clock signal; and said phase interpolator to generate the aligned clock signal from the plurality of clock phases.

* * * * *